United States Patent [19]

Steele

[11] Patent Number: 5,675,824
[45] Date of Patent: Oct. 7, 1997

[54] PROGRAMMABLE LOGIC HAVING SELECTABLE OUTPUT VOLTAGES

[75] Inventor: Randy C. Steele, Folsom, Calif.

[73] Assignee: Intel Corporation, Santa Clara, Calif.

[21] Appl. No.: 573,584

[22] Filed: Dec. 15, 1995

Related U.S. Application Data

[63] Continuation of Ser. No. 343,202, Nov. 22, 1994, abandoned, which is a continuation of Ser. No. 954,250, Sep. 30, 1992, abandoned.

[51] Int. Cl.$^6$ ............................................. G06F 11/30
[52] U.S. Cl. ................ 395/800; 365/290; 365/291; 407/475; 364/DIG. 1; 395/500
[58] Field of Search ............................ 395/800; 365/290, 365/291, 209; 407/475; 364/DIG. 1

[56] References Cited

U.S. PATENT DOCUMENTS

| | | | |
|---|---|---|---|
| 4,574,273 | 3/1986 | Atsumi et al. | 327/543 |
| 4,585,958 | 4/1986 | Chung et al. | 326/56 |
| 4,751,405 | 6/1988 | Butano, Jr. et al. | 307/350 |
| 4,782,247 | 11/1988 | Yoshida | 307/449 |
| 4,782,250 | 11/1988 | Adams et al. | 327/108 |
| 4,856,079 | 8/1989 | Wedgwood et al. | 455/50.1 |
| 5,008,566 | 4/1991 | Hashimoto | 307/296.8 |
| 5,151,619 | 9/1992 | Austin et al. | 326/86 |
| 5,199,032 | 3/1993 | Sparks et al. | 371/3 |
| 5,223,751 | 6/1993 | Simmons et al. | 307/475 |
| 5,260,643 | 11/1993 | Sandhu | 323/225 |
| 5,262,705 | 11/1993 | Hattori | 318/479 |
| 5,297,097 | 3/1994 | Etoh et al. | 395/226 |
| 5,304,872 | 4/1994 | Avraham et al. | 307/475 |
| 5,325,335 | 6/1994 | Ang et al. | 365/205 |

OTHER PUBLICATIONS

"Solid State", IEEE Jan. 1992, pp. 42–44.
"M6800 Family Reference", 1988, pp. 4–60.
"M68000 Family Reference Manual," 1990, pp. 5–48—5–95.

Primary Examiner—Alyssa H. Bowler
Assistant Examiner—Dzung C. Nguyen
Attorney, Agent, or Firm—Blakely, Sokoloff, Taylor & Zafman

[57] ABSTRACT

A programmable logic device having a plurality of gates which can be programmed to implement a plurality of product terms for representing logic functions, wherein an input signal is processed according to the logic functions, and a resulting output signal is generated having a selectable output voltage level. A desired output voltage level is specified. A generator supplies the desired output voltage to an output buffer of the programmable logic device. This generator may operate independently from the generator used to supply power to the programmable logic device. The processed signal drives the output buffer, and the output signal from the output buffer corresponds to the desired output voltage.

10 Claims, 7 Drawing Sheets

PROGRAMMABLE LOGIC HAVING SELECTABLE OUTPUT VOLTAGES

This is a continuation of application Ser. No. 08/343,202, filed Nov. 22, 1994, now abandoned, which is a continuation of application Ser. No. 07/954,250, filed Sep. 30, 1992 abandoned.

FIELD OF THE INVENTION

The present invention pertains to the field of programmable logic devices. More particularly, the present invention relates to an apparatus and method for selecting a desired output voltage for a programmable logic device.

BACKGROUND OF THE INVENTION

Historically, advances in fabrication and manufacturing techniques in regards to semiconductor technology have led to greater reductions in the physical dimensions required for implementing semiconductor devices. As a result, ever increasing numbers of transistors, gates and other types of components are being achieved within a given silicon die size. This trend towards even smaller, denser, and more complex semiconductor chips is predicted to continue.

However, one obstacle hindering further miniaturization is that physical limits are being encountered, wherein the p-n junctions of a semiconductor "break down." Basically, when a sufficiently high field is applied to a p-n junction, it breaks down and conducts a very large current. This effect is of grave concern as smaller dimensions have greater tendencies of breaking down. In an effort to mitigate this highly undesirable aspect of semiconductors, operating voltage levels are being reduced from the current industry standard of 5 volts to a lower level of 3 volts. Presently, high capacity dynamic random access memories (DRAMs) operating on 3 volts are commercially available. In the near future, the faster static random access memories (SRAMs) having the capability of operating on 3 volts will probably be introduced. Once memories are converted to operating on a 3 volt reference, processors are likely to follow suite. Eventually, a whole family of semiconductor devices operating on a 3 volt reference will probably evolve. This transition from 5 volts to 3 volts will be a long, slow, and arduous process. In the meantime, circuit designers are faced with a dilemma of whether to implement their designs by using either 3 or 5 volt devices.

One approach has been to design 3 volt devices so that they are protected in case a 5 volt signal is applied. However, one disadvantage is that, typically, additional hardware need be incorporated. The impact of such protection circuitry tends to decrease the overall speed of the device. In any event, these 3 volt devices typically fail to provide the capability of outputting 5 volt signals, which might be required by various destination circuits.

This 3/5 volt dilemma is particularly troublesome in relation to programmable logic devices (PLDs), wherein, due to their programmable nature, it is unknown at the time of manufacture whether the PLD is to handle 3 or 5 volt applications.

PLDs are comprised of an array of gates having programmable interconnections. The gates are programmed according to a specification provided by a circuit designer, thereby resulting in the desired logic functions. PLDs are popular because they allow designers to tailor building block solutions to individual systems requirements. In addition, PLDs are typically less expensive, have faster turn around time for implementing a particular circuit design, and are easier to make subsequent modifications in comparison to dedicated integrated circuits (ICs) or application specific integrated circuits (ASICs).

Most PLDs are capable of handling only 5 volt signals. It is possible to adapt these 5 volt PLDs to handle 3 volt applications by implementing a voltage regulator or a resistive network for stepping down the voltage level. However, there is a performance penalty associated with implementing voltage conversions thusly. Given a 60 MHz clock rate at which some of the present personal computers are running on the board level, there is only approximately a 16 nsec margin for a PLD to fetch, process, and return the data. Consequently, there is minimal time left over to perform voltage level shifting functions. Another risk inherent with voltage converters is that the 3 and 5 volt supplies are not necessarily correlated together. One could have a 5 volt supply at its maximum acceptable range and an independent 3 volt supply at its minimum range. Consequently, performing a voltage conversion on the regulated 5 volt supply might result in a levels mismatch. This could lead to latch-up, overshoot, or other undesireble complications.

Thus, what is needed is a PLD having the flexibility of processing and outputting 3 and/or 5 volt applications. It would also be highly preferable to implement such a PLD whereby performance degredations are minimized.

SUMMARY OF THE INVENTION

In view of the problems associated with various devices having different operating voltages, one object of the present invention is to provide a programmable logic device capable of handling signals having different output voltages.

Another object of the present invention is to minimize attendant performance degradation.

Another object of the present invention is to provide an interface between devices operating on different voltages.

Another object of the present invention is to provide a user with the capability of selecting a voltage level for an output signal, irregardless of the input voltage level.

Yet another object of the present invention is to provide an output signal voltage level which is derived from that signal's input power supply.

These and other objects of the present invention are implemented in a programmable logic device wherein a user can select a particular voltage level for setting certain output signals.

The programmable logic device is divided into several functional blocks which are intercoupled by a bus. Each functional block is capable of accepting up to twenty-four bit-wide inputs. The input signals are processed according to the product terms programmed into that functional block. Up to ten output signals can be generated.

There is an output supply voltage pin, $V_{cco}$, associated with each functional block. The purpose of the $V_{cco}$ pin is to supply the output signal voltage. A user can specify a particular output supply voltage to be coupled to the $V_{cco}$ pin of a particular functional block. All output signals generated by that functional block has a voltage level corresponding to the output supply voltage on its $V_{cco}$ pin. Each logic function is matched to a functional block based upon its output signal voltage requirements. Thus, a plurality of different voltages can be supplied to the $V_{cco}$ pins of different functional blocks, resulting in a plurality of different voltages, as desired, for output signals.

In the currently preferred embodiment, either 3 or 5 volts are supplied to the various $V_{cco}$ pins. In this manner, the PLD has the flexibility to interface with external devices operating on either a 3 or 5 volt basis. Furthermore, the same power supply used by the external devices can also be coupled to the $V_{cco}$ pins. This minimizes the chance for voltage level mismatches between the programmable logic device and the interfaced external devices. Moreover, the output buffer of the present invention is tristated so that an I/O pin can be used to accept input signals (even 5 volt input signals).

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A programmable logic device having a mechanism for selecting a voltage level for output signals is described. In the following description, for purposes of explanation, numerous specific details are set forth, such as certain voltages, output buffer configurations, etc., in order to provide a thorough understanding of the present invention. It will be obvious, however, to one skilled in the art that the present invention may be practiced without these specific details. In other instances, well-known structures and devices are shown in block diagram form in order to avoid unnecessarily obscuring the present invention.

Figure 1:
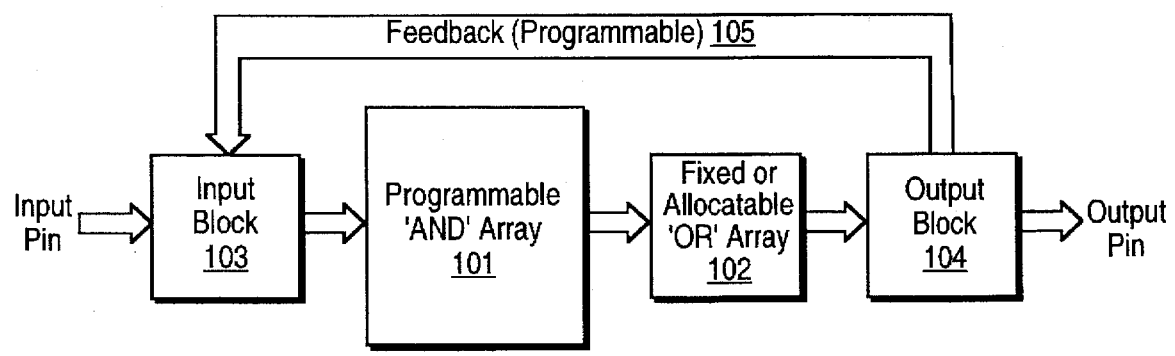
FIG. 1 is a block diagram illustrating an architecture of a typical programmable logic device.

FIG. 1 is a block diagram of the general architecture of a PLD. The PLD is internally structured as a variation of the PLA architecture—an array of programmable AND gates 101 coupled to a fixed or allocatable array of OR gates 102. PLDs make use of the fact that any logic equation can be converted to an equivalent sum-of-products (SOP) form. Hence, logic equations can be implemented in an AND/OR architecture. The basic PLA structure is augmented with input block 103 and output block 104. Input block 103 is comprised of latches and various programmable input options, and output block 104 is comprised of output controls, registers, etc. In addition, programmable feedback 105 allows a user to implement sequential logic functions as well as combination logic.

The number and location of the programmable connections between the AND and OR matrices, along with the input and output blocks, are predetermined by the architecture of the PLD. The user specifies which of these connections are to remain open and which are to be closed, depending on the logic requirements. The PLD is programmed accordingly. Programmability of these connections can be achieved using various memory technologies such as fuses, EPROM cells, EEPROM cells, or static RAM cells. Typically, a user purchases a PLD off-the-shelf and by using a development system running on a personal computer, can produce a customized integrated circuit.

Figure 2:
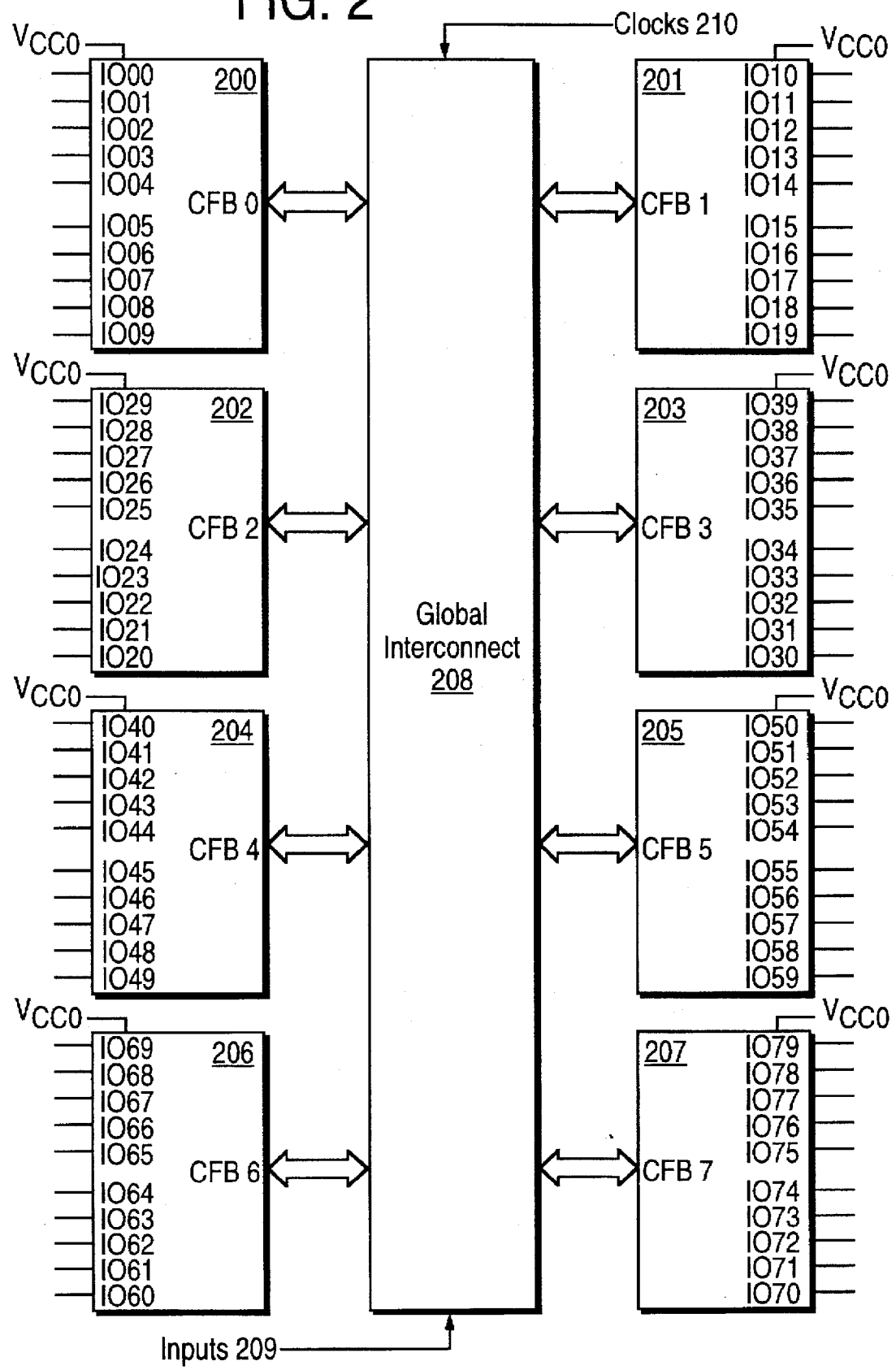
FIG. 2 is a block diagram illustrating a field programmable gate array upon which the present invention can be practiced.

FIG. 2 is a block diagram illustrating a field programmable gate array (FPGA) upon which the present invention can be practiced. The FPGA is comprised of eight configurable function blocks (CFBs) 200–207 coupled together by a global interconnect 208. Each of the CFBs is similar to a PLA. Data 209 and clock 210 lines are input to CFBs 200–207 via global interconnect 208. Global interconnect 208 is a bus having an interconnecting matrix which renders each of the CFB blocks connectable. Any combination of signals in the matrix can be routed to any CFB block, up to the maximum fan-in of the block.

The CFBs 200–207 accept 24 bit wide inputs from global interconnect 208. Based on the inputs and the programmability up to ten outputs can be generated per CFB. In other words, 80 outputs IO00–IO79 can be generated by the eight CFBs 200–207. This type of device is known as a 24V10, where the "V" connotes variable programming.

The PLD is powered by a 5.0 supply voltage on the $V_{cc}$ pin. $V_{ss}$ is ground. In addition, in the currently preferred embodiment of the present invention, there is a separate $V_{cco}$ pin associated with each of the CFB's 200–207 (i.e., eight $V_{cco}$ pins).

The $V_{cco}$ pins correspond to the output supply voltage. By coupling the desired output voltage to a $V_{cco}$ pin, a user can select the voltage level of signals being output from a particular CFB. Once a user specifies a $V_{cco}$ voltage for a particular CFB, that whole block outputs signals at the specified voltage level. In this manner, a user can specify a plurality of different voltage levels for output signals. For example, a user could couple the $V_{cco}$ of CFB0 to a supply voltage of 5 volts while simultaneously coupling the $V_{cco}$ of CFB1 to a supply voltage of 3 volts. Hence, output signals from CFB0 are at a 5 volt level, which can be properly utilized by external devices operating on a 5 volt signal reference. Meanwhile, output signals generated by CFB1 are at a 3 volt level. These 3 volt output signals can then be used by those devices operating on signals at a 3 volt reference. The software used in programming the PLD to perform desired logic functions also performs the task of grouping together those signals requiring the same voltage level. The software assigns the various groups of output signals to the appropriate CFB having the corresponding voltage level on its $V_{cco}$ pin.

Note that even though the PLD, itself, is powered by 5 volts, a user has the ability to choose the voltage level for signals output from the CFBs. This holds true, irregardless of what voltage levels are for the input signals. Thereby, the PLD can act as an interface between external devices having different operating voltages. For example, the present invention can interface between a 3 volt floppy disk controller and a 5 volt microprocessor by implementing one $V_{cco}$ tied to 3.0 volts and another $V_{cco}$ tied to 5.0 volts.

In addition, the same power supplies used to power the external devices can be coupled to the various $V_{cco}$ pins. Thereby, the output voltage levels from the CFB are functions of and are closely correlated to the voltage supplied to/from the external devices. This greatly minimizes the chances of voltage level mismatches and any attendant latch-up, overshoot, etc., conditions.

In an alternative embodiment, since functions are not pre-defined in a PLD, multiple output voltage supply pins are input to each CFB. This enables a user to select among the different supply voltages for each of the separate outputs from a single CFB. For example, a CFB can have two separate $V_{cco}$ pins: one coupled to a supply voltage and another coupled to a 5 supply voltage. Separate output signals generated by this CFB has the option of either being 3 or 5 volts. Consequently, this embodiment has greater resolution, but at the expense of increasing the number of power pins required.

Figure 3:
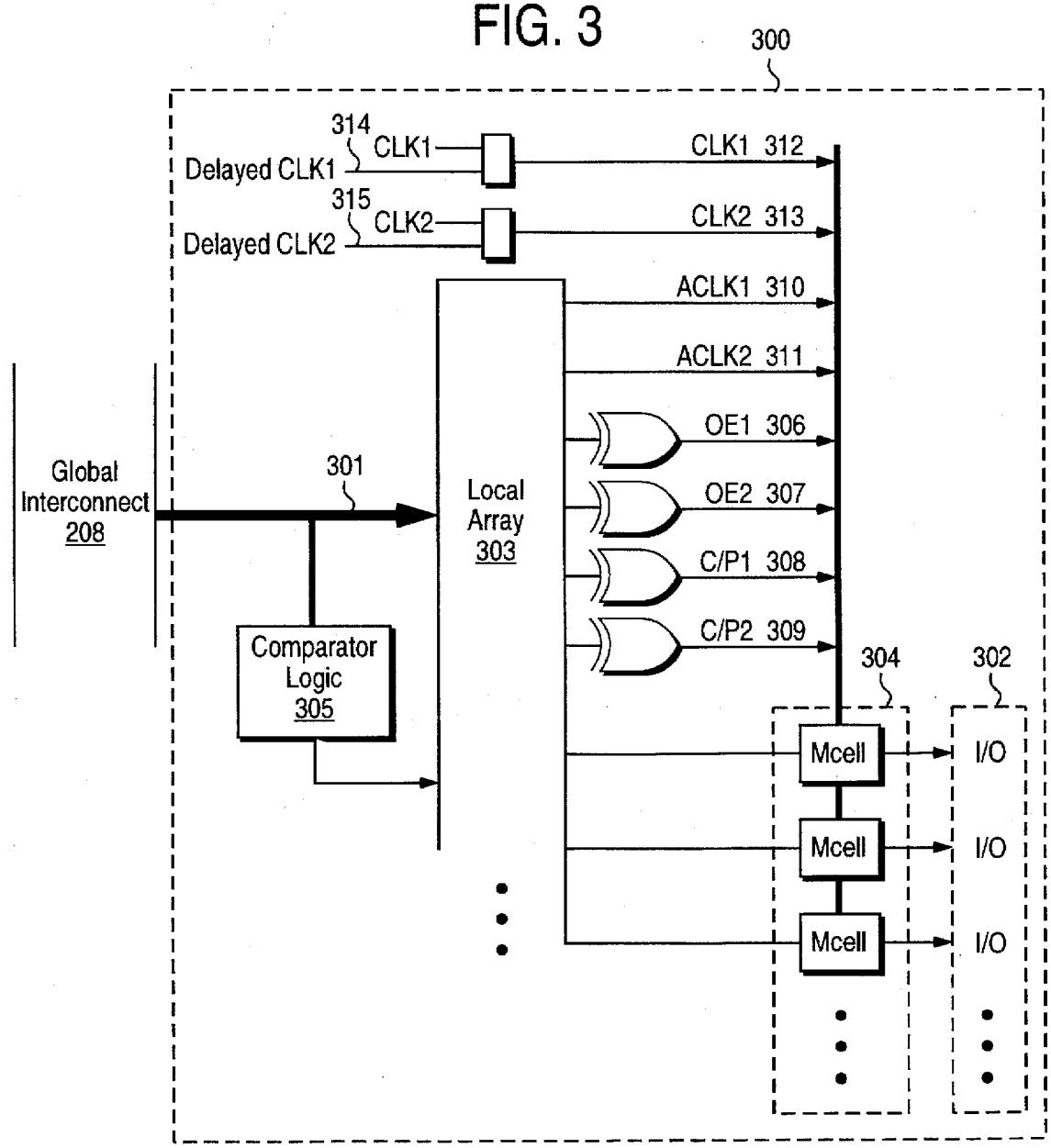
FIG. 3 is a block diagram illustrating a configurable function block of a field programmable gate array.

FIG. 3 is a block diagram illustrating a configurable function block 300. The CFB is comprised of a local array 303, ten programmable macrocells 304, comparator logic 305, four control signals 306–309, and four clock lines 310–313. There are 66 p-terms within a CFB. A user can program any combination of the 48 inputs (i.e., 24 inputs plus their complements) independently on all 66 of the p-terms. Six of the 66 p-terms are used as control and clock signals. The remaining 60 p-terms are distributed to the 10 outputs. Each output is driven by a macrocell. There are 10 macrocells in each CFB, one macrocell per output. Local array 303 is comprised of a programmable product term array and a p-term allocation circuit. The ten macrocells 304 can be programmed to function as an input as well as a combination, registered output, or bidirectional I/O. In the currently preferred embodiment, each CFB also has a programmable output polarity and programmable feedback options which allow greater flexibility in meeting target applications. The local array 303 and macrocells 304 will be described in detail below.

Comparator logic 305 can perform an identity compare of up to 12 bits. The number of bits that can be compared is limited by the fan-in of the CFB. Since the current fan-in is 24 signals, a 12 bit comparator is implemented. When less than 12 bits are being compared, the remaining available signals can be used in other logic equations. For instance, an 8-bit compare leaves 8 other signals on the block fan-in (i.e., 24–16=8). The bits being compared may also be used to implement sum-of-product (SOP) logic in parallel with the compare function. The output of comparator logic 305 can be allocated in place of a p-term set in one of the macrocells 304. Additionally, the comparator logic 305 has an invert option, and the macrocell has an open drain output option. By using the macrocell/comparator inversion controls along with the open drain output option, a user can implement Compare/AND, Compare/OR, or Compare/AND/OR logic.

The four control signals 306–309 associated with each CFB is comprised of two Output Enable (OE) signals 306–307 and two asynchronous Clear/Preset (C/P) signals 308–309. Each control signal is generated by a single p-term from the local block AND array. Each control signal also has an inversion option.

There are three clocking options available for each macrocell 304: synchronous, delayed, and asynchronous. Synchronous clock lines 312 and 313 are the standard clock modes, wherein the register clock is driven directly from the device clock pins. Delayed mode is similar to the synchronous mode, except that there is a delay which is added to the clock signal at the block level. The delay can be added to one or both of the synchronous clocks as indicated by delayed clock lines 314 and 315. In the asynchronous mode, the register clock utilizes one of the two block-level single product term asynchronous clock signals. There are two asynchronous clock lines 310 and 311.

Figure 4:
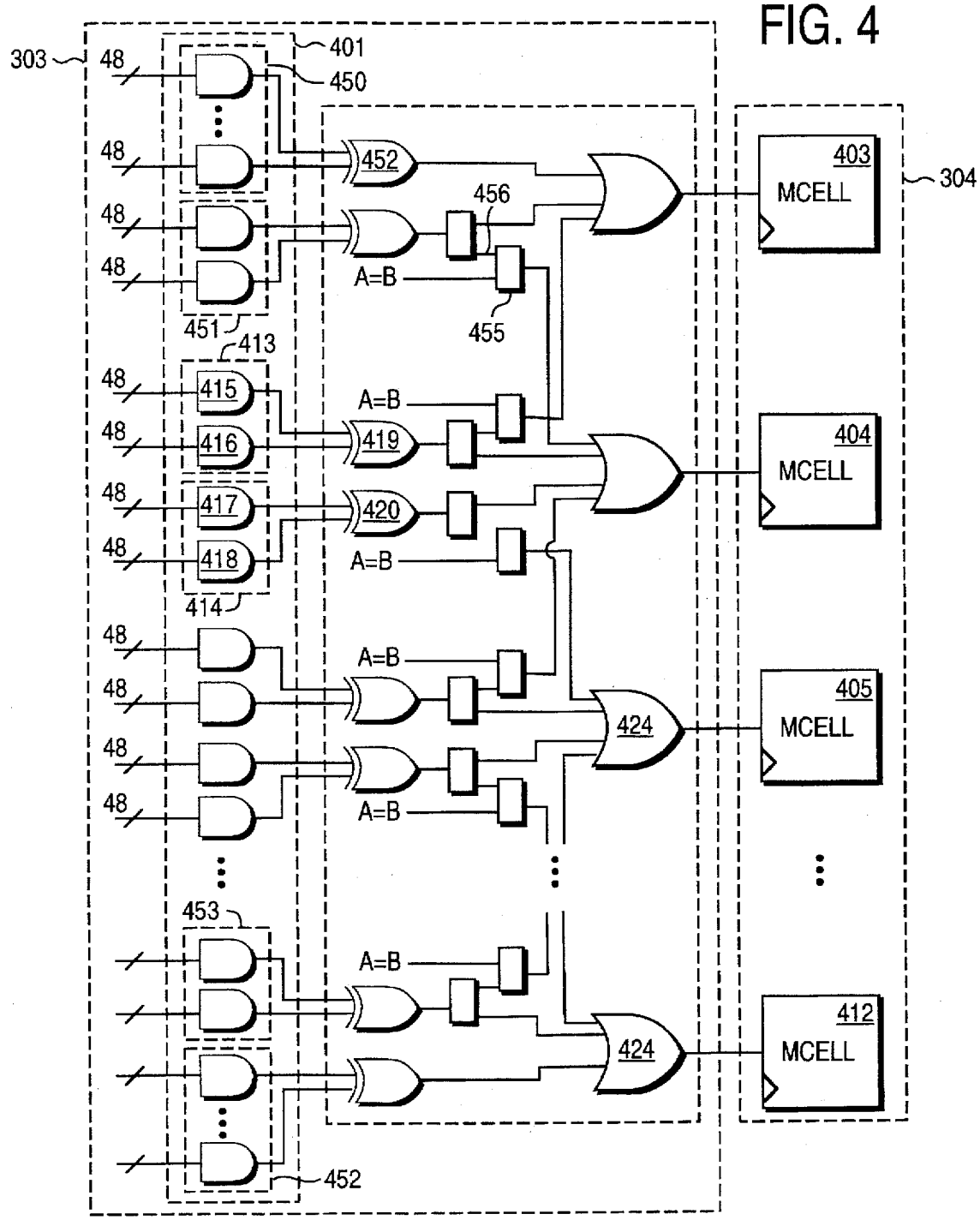
FIG. 4 is a block diagram illustrating a local array and macrocells of a field programmable gate array of the currently preferred embodiment of the present invention.

FIG. 4 is a block diagram illustrating the local array 303 and ten macrocells 304. Local array 303 is comprised of a programmable AND array 401 followed by an OR array 402.

A set of twelve product terms 450 and 452 are allocated and hardwired to the first and last macrocells 403 and 412. In addition, each of the two end macrocells also has a set of steerable product terms 451 and 453. There are two sets of steerable product terms associated with each of the middle eight macrocells. Each set has two product terms. For example, macrocell 404 has, by default, two sets of p-terms, sets 413 and 414. Set 413 is comprised of a first p-term denoted by inputting 48 inputs to a first programmable AND gate 415 and a second p-term denoted by inputting 48 inputs to a second programmable AND gate 416. The 48 inputs originate from the 24 true and 24 complemented inputs from the global interconnect.

Each of the programmable AND gates allows a user to AND together any combination of the 48 inputs (e.g., input 1 AND input $\overline{4}$ AND input 7, etc.). Similarly, p-term set 414 includes two programmable 48-bit input AND gates 417 and 418. The outputs from each of the p-term sets are input to an OR gate. For example, the two outputs from AND gates 415 and 416 are input to OR gate 419. Likewise, the two outputs from AND gates 417 and 418 are input to OR gate 420. The product term allocation circuit uses multiplexers to steer each set to its associated macrocell or to an adjacent macrocell. Each multiplexer is controlled by a bit stored in SRAM. Consequently, each of the macrocells has the option of accepting unused product terms from adjacent macrocells on an as needed basis.

In an alternate embodiment, two SRAM bits could be used to allow the inputted p-term to be passed to either macrocell or both macrocells. Once the p-terms have been properly steered, they are routed through a fixed OR gate before being input to the macrocells. The fixed OR gate completes the sum-of-products (SOP) function.

In addition, there is also a second A=B multiplexer following each of the p-term steering multiplexers. Under the control of an additional SRAM bit, the A=B function may replace a p-term set in a given macrocell.

Figure 5:
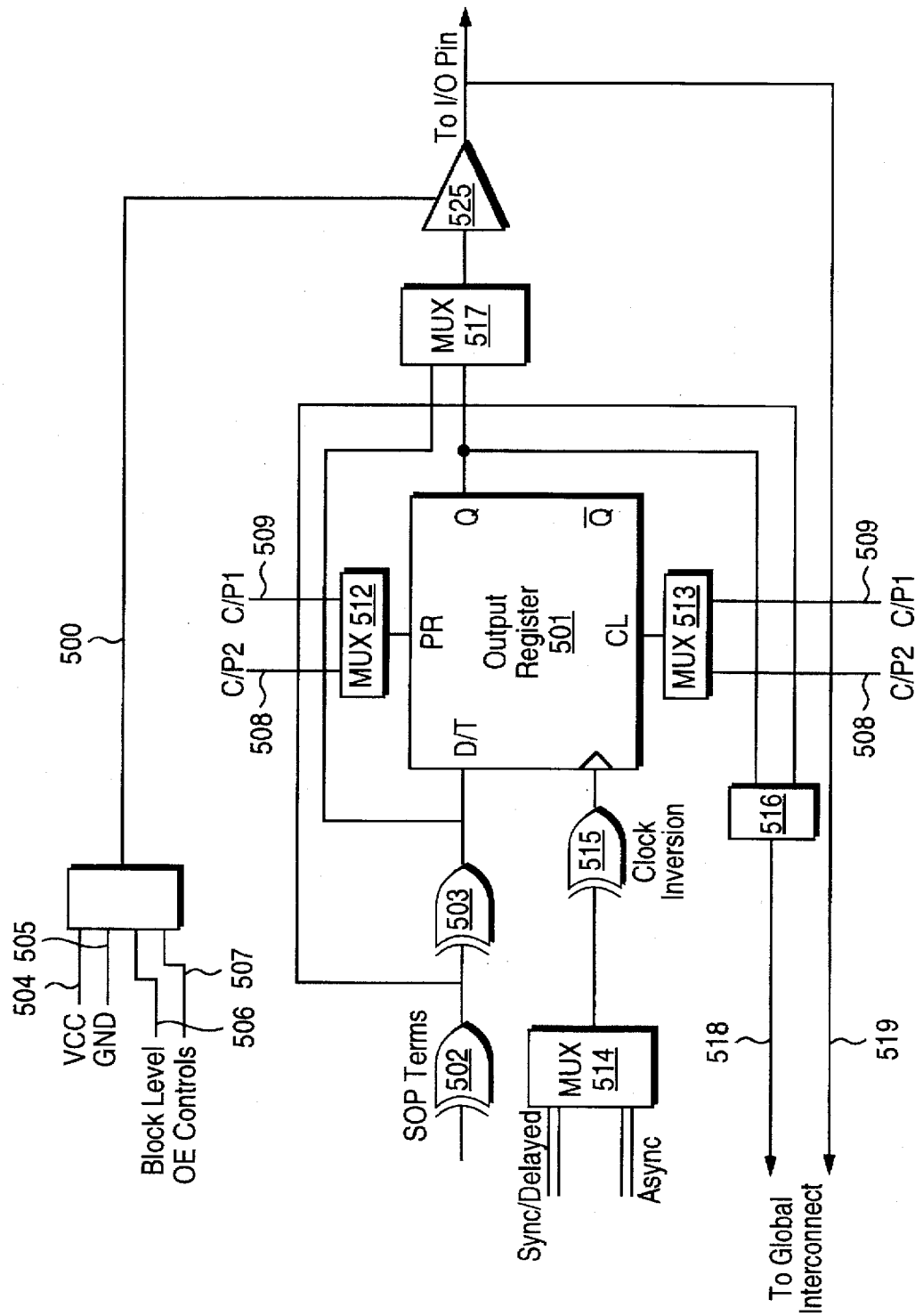
FIG. 5 is a block diagram illustrating a macrocell configuration.

FIG. 5 is a block diagram illustrating a macrocell 500 configuration. Macrocell 500 is comprised of an output register 501 which can be configured as either a combinatorial block, a D-register, or a Toggle flip-flop. The SOP terms from the logic array are fed into OR gate 502 and passed through XOR gate 503 to the output register 501. Multiplier 517 selects whether to send the output from the XOR gate 503 or the Q or $\overline{Q}$ output from register 501 to output buffer 518. Output buffer 518 outputs the signal at the $V_{cco}$ voltage level for that CFB.

$V_{cc}$ (i.e., the supply voltage for the device) and ground lines 504–505 are provided for each macrocell. Furthermore, the block level output enable (OE) controls 506 and 507 specify three state buffering operations. The $V_{cc}$ option specifies an output operation, while the $V_{ss}$ option specifies an input operation.

Macrocell 500 has dual feedback paths 518 and 519 coupled back to the global interconnect. One feedback path 518 is internal, whereas the other feedback path 519 is coupled to an I/O pin. This feature allows I/O pins being used for buried logic to also be used as inputs. These I/Os may still be used to provide buried logic, since internal feedback is available. Multiplexer 516 selects whether to put the SOP terms or the Q output from register 501 onto internal feedback line 518.

Output register 501 can be cleared or preset using global clear and preset p-terms via the Clear and Preset lines 508–509. Multiplexers 512 and 513 select which of the two C/P signals are used. Multiplexer 514 selects which of the synchronous/delayed or asynchronous clock is used to clock output register 501. The clocked output is fed into XOR gate 515 before being used as a clock input to output register 501. XOR gate 515 provides a clock invert option which allows output register 501 to be independently clocked on either the rising or falling edge of the global clock.

Figure 6:
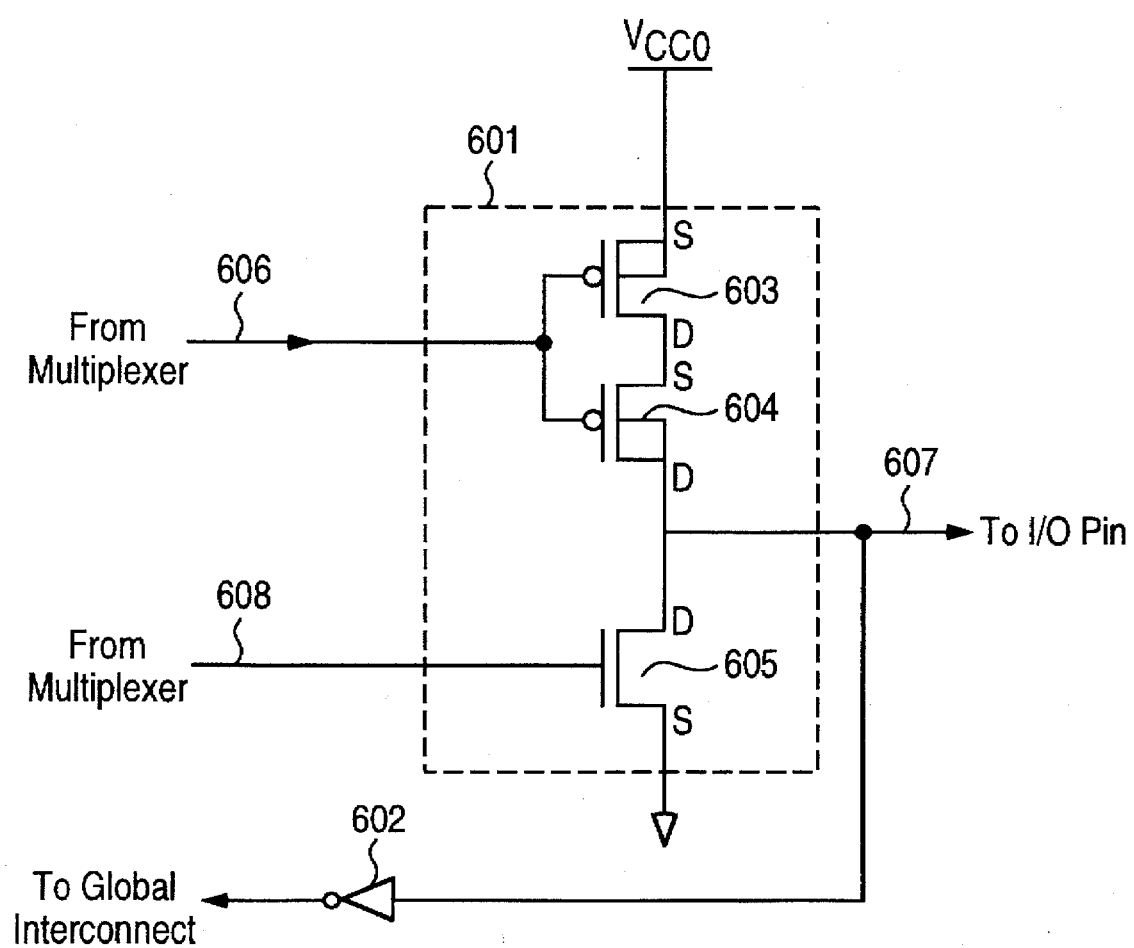
FIG. 6 is a circuit diagram illustrating an output buffer as may be used to select the voltage level for an output signal.

FIG. 6 is a circuit diagram illustrating the output buffer 601 and an input driver 602. Output buffer 601 is comprised of a pair of p-channel transistors 603 and 604 in series with an n-channel transistor 605. The source of transistor 603 is coupled to the $V_{cco}$ pin for that particular CFB. The source of transistor 605 is coupled to $V_{ss}$ (i.e., ground). Output buffer 601 operates as follows. A low signal (i.e., 0 volts) on input line 606 switches the p-channel transistors 603 and 604 "ON" while a corresponding low signal on line 608 switches n-channel transistor 605 "OFF." This results in the voltage on the $V_{cco}$ pin being output on line 607 to an I/O pin of the PLD. Conversely, a high signal (i.e., 5 volts) on input line 606 switches the p-channel transistors 603 and 604 "OFF" while a corresponding high signal 608 switches n-channel transistor 605 "ON." This results in effectively grounding output line 607.

Furthermore, output buffer 601 is capable of being tristated. In other words, its output is either $V_{cco}$, effectively grounded, or floating (i.e., high impedance looking back into the drains of transistors 604 and 605). The output enable signal initiates the high impedance state by switching all three transistors 603–605 "OFF" by taking 606 high and 608 low. When in the high impedance state, the I/O pin can act as an input. An inverter 602 is utilized as an input buffer for driving additional circuits. Note that output buffer 601 is unaffected, even if a 5 volt signal is accidentally or intentionally input with $V_{cco}$ being set at 3 volts and vice versa. In other words, it is safe to have either 3 or 5 volt input signals on line 607.

Logic functions requiring the same voltage levels for their outputs are grouped together and assigned to a particular CFB by the software used in programming the PLD. The desired output voltage is put on the $V_{cco}$ of that CFB. As discussed above, the desired voltage for the output signal is put on the I/O pin by the output buffer in the macrocell.

Initially, the PLD is programmed according to a specification provided by a circuit designer. A piece of hardware, known as a programmer, is coupled to a microcomputer. A piece of software takes the specification and automatically determines which of the corresponding non-volatile memory bits are to be programmed to achieve the desired logic function. The software also performs minimization tasks, wherein complex logic equations are reduced to equivalent but more simplified equations and assigns the p-terms accordingly. It is this software which also groups the logic functions requiring a particular output signal level to certain CFBs.

Figure 7:
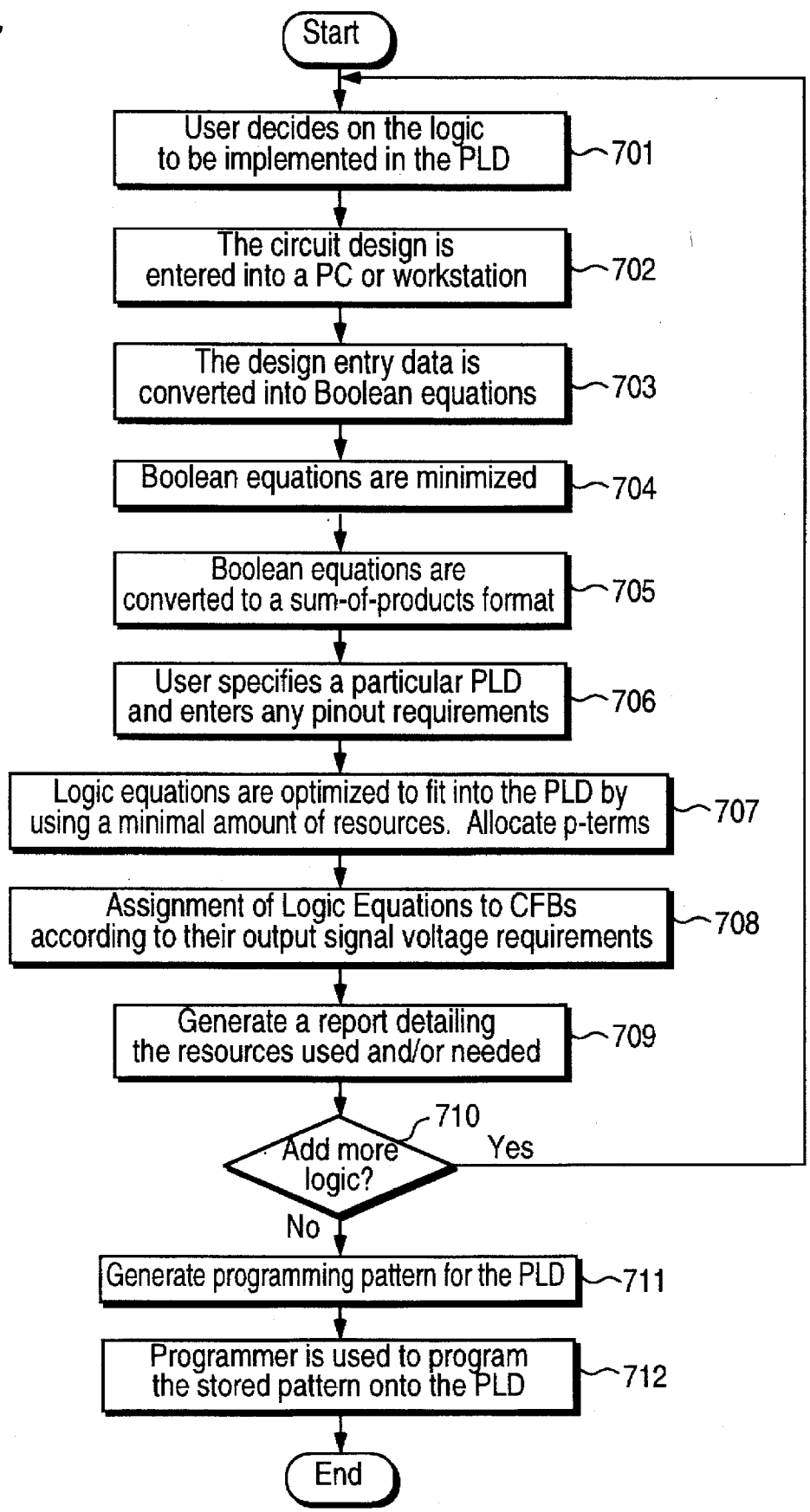
FIG. 7 is a flowchart illustrating steps in a design process for PLDs.

FIG. 7 is a flowchart illustrating the steps in a design process for PLDs. First, the user decides on the desired logic to be implemented in the PLD, step 701. The circuit design is entered into a personal computer or workstation, step 702. The design entry can be accomplished by the following methods: 1) schematic capture—a mouse or some other graphic input device is used to input schematics embodying the logic, 2) net list entry—a user enters the design to the computer by describing the symbols and interconnections in words via a standardized format (i.e., a net list), 3) state equation/diagram—entry of a sequential design involving states and transitions between states (equations or a state table can also be used to define a state machine), and 4) Boolean equations which involves expressing the logic in terms of Boolean algebraic equations.

Next, the software converts all design entry data into Boolean equations (if necessary), step 703. The Boolean equations are converted to a sum-of-products (SOP) format after logic reduction, steps 704 and 705. The logic is minimized through heuristic algorithms. The user can specify the particular PLD for the design to be implemented and any pinout requirements, step 706. The software optimizes the logic equations to fit into the device, using the minimum amount of resources (e.g., I/O pins, registers, product terms, macrocells, etc.), step 707. This step allocates the p-terms accordingly. Logic equations are assigned to CFBs according to their output voltage signal requirements. A detailed report describing the resources used in fitting the design on the PLD is generated, step 709. This allows a user to incrementally stuff in logic if there is availability, step 710. In addition, if the design overflowed the PLD (i.e., the chosen PLD does not have the resources required to implement the design), a list of the resources needed to complete the design is generated. A user can choose a larger PLD or partition the initial design into two different PLDs. The appropriate program pattern for the PLD is generated, step 711. A programmer is used to program the stored pattern onto the PLD, step 712.

Thus, a programmable logic device having selectable output voltages is disclosed.

What is claimed is:

1. A programmable logic device, comprising:
   a first pin that receives a first external power supply voltage having a first non-zero voltage level;
   a first block of gates that performs first pre-programmed logic functions with respect to first input signals to produce a first group of output signals at a second non-zero voltage level, the first block of gates are not coupled to the first pin and is not powered by the first external power supply voltage;
   a first output buffer, coupled to the first block of gates and directly connected to the first pin, that receives the first group of output signals and outputs the first group of output signals at the first non-zero voltage level provided by the first pin such that an external circuit also powered by the first external power supply voltage can receive the first group of output signals at the first non-zero voltage level without voltage conversion;
   a second pin that receives a second external power supply voltage having a third non-zero voltage level;
   a second block of gates that performs pre-programmed second logic functions with respect to second input signals to produce a second group of output signals at a forth non-zero voltage level, the second block of gates is not coupled to the second pin and are not powered by the second external power supply voltage;
   a second output buffer, coupled to the second block of gates and directly connected to the second pin, that receives the second group of output signals and outputs the second group of output signals at the third non-zero voltage level of the second external power supply voltage provided by the second pin such that a second external circuit also powered by the second external power supply voltage can receive the second group of output signals at the third non-zero voltage level without voltage conversion, wherein the third non-zero voltage level is different from the first non-zero voltage level.

2. The programmable logic device of claim 1 further comprising a second circuit that varies the third non-zero voltage level.

3. The programmable logic device of claim 1, wherein the second output buffer comprise a p-channel transistor and an n-channel transistor.

4. The programmable logic device of claim 1 further comprising a second logic that enables and disables the second output buffer.

5. The programmable logic device of claim 1, wherein the first non-zero voltage level is approximately five volts and the third non-zero voltage level is approximately 3 volts.

6. The programmable logic device of claim 1 further comprising a circuit for varying the first non-zero voltage level.

7. The programmable logic device of claim 1, wherein the output buffer comprises a p-channel transistor and an n-channel transistor.

8. The programmable logic device of claim 1 further comprising logic that enables and disables the output buffer.

9. The programmable logic device of claim 1, wherein the first non-zero voltage level is approximately five volts.

10. A programmable logic device having multiple non-zero voltage level outputs comprising:

a first pin that receives a first supply voltage having a first non-zero voltage level;

a first block of gates that performs pre-programmed first logic functions with respect to first input signals to produce a first group of output signals at a second non-zero voltage level;

a first output buffer coupled to the first block of gates and directly connected to the first pin, the output buffer receiving the first group of output signals and outputting the first group of output signals at the first non-zero voltage level provided by the first pin;

a second pin that receives a second supply voltage having a third non-zero voltage level;

a second block of gates that performs pre-programmed second logic functions with respect to second input signals to produce a second group of output signals at a forth non-zero voltage level;

a second output buffer coupled to the second block of gates and directly connected to the second pin, the second output buffer receiving the second group of output signals and outputting the second group of output signals at the third non-zero voltage level provided by the second pin.

* * * * *

UNITED STATES PATENT AND TRADEMARK OFFICE
CERTIFICATE OF CORRECTION

PATENT NO. : 5,675,824

DATED : October 7, 1997

INVENTOR(S) : Randy C. Steele

It is certified that error appears in the above-identified patent and that said Letters Patent is hereby corrected as shown below:

In column 2 at line 21 delete "undesireble" and insert --undesirable--

In column 2 at line 25 delete "degredations" and insert --degradations--

Signed and Sealed this

Sixth Day of January, 1998

Attest:

Attesting Officer

BRUCE LEHMAN

Commissioner of Patents and Trademarks